(12) United States Patent
Leung et al.

(10) Patent No.: US 10,410,941 B2
(45) Date of Patent: Sep. 10, 2019

(54) WAFER LEVEL SEMICONDUCTOR DEVICE WITH WETTABLE FLANKS

(71) Applicant: Nexperia B.V., Nijmegen (NL)

(72) Inventors: Chi Ho Leung, Hong Kong (HK);
Pompeo V. Umali, Hong Kong (HK);
Shun Tik Yeung, Hong Kong (HK);
Kan Wae Lam, Hong Kong (HK)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 15/259,063

(22) Filed: Sep. 8, 2016

(65) Prior Publication Data

US 2018/0068920 A1    Mar. 8, 2018

(51) Int. Cl.
*H01L 23/31* (2006.01)
*H01L 21/78* (2006.01)
(Continued)

(52) U.S. Cl.
CPC ........ *H01L 23/3114* (2013.01); *H01L 21/565* (2013.01); *H01L 21/6836* (2013.01); *H01L 21/78* (2013.01); *H01L 23/3121* (2013.01); *H01L 23/3185* (2013.01); *H01L 23/552* (2013.01); *H01L 24/03* (2013.01); *H01L 24/05* (2013.01); *H01L 24/32* (2013.01); *H01L 24/83* (2013.01); *H01L 24/96* (2013.01); *H01L 23/147* (2013.01); *H01L 24/06* (2013.01); *H01L 2224/02371* (2013.01); *H01L 2224/03002* (2013.01); *H01L 2224/0345* (2013.01); *H01L 2224/0346* (2013.01); *H01L 2224/03462* (2013.01); *H01L 2224/0401* (2013.01); *H01L 2224/04026* (2013.01);
(Continued)

(58) Field of Classification Search
None
See application file for complete search history.

(56) References Cited

U.S. PATENT DOCUMENTS

2003/0143819 A1   7/2003 Hedler et al.
2009/0314525 A1*  12/2009 Kajino ................ H05K 1/0265
                                                      174/255

(Continued)

OTHER PUBLICATIONS

Lee J. Smith and Jun Dimaano Jr., "Development Approach and Process Optimization for Sideway WLCSP Protection", IWLPC Extended Abstract, Oct. 13-15, 2015, San Jose, CA, 2015.
(Continued)

*Primary Examiner* — Long Pham
(74) *Attorney, Agent, or Firm* — Ohlandt, Greeley, Ruggiero & Perle, L.L.P.

(57) ABSTRACT

A semiconductor device includes a semiconductor die having a top surface that has one or more electrical contacts formed thereon, and an opposite bottom surface. A molding material encapsulates the top surface and at least a part of a side surface of the semiconductor die. The molding material defines a package body that has a top surface and a side surface. Openings are formed on the top surface of the package body, and the electrical contacts are partially exposed from the molding material through the openings. A metal layer is formed over and electrically connected to the electrical contacts through the openings. The metal layer extends to and at least partially covers the side surface of the package body.

18 Claims, 9 Drawing Sheets

(51) Int. Cl.
  *H01L 21/56* (2006.01)
  *H01L 23/00* (2006.01)
  *H01L 23/552* (2006.01)
  *H01L 21/683* (2006.01)
  *H01L 23/14* (2006.01)

(52) U.S. Cl.
  CPC ............... *H01L 2224/04105* (2013.01); *H01L 2224/05022* (2013.01); *H01L 2224/05147* (2013.01); *H01L 2224/05548* (2013.01); *H01L 2224/05582* (2013.01); *H01L 2224/05611* (2013.01); *H01L 2224/0615* (2013.01); *H01L 2224/10145* (2013.01); *H01L 2224/26145* (2013.01); *H01L 2224/2929* (2013.01); *H01L 2224/32225* (2013.01); *H01L 2224/838* (2013.01); *H01L 2224/8385* (2013.01); *H01L 2224/9202* (2013.01); *H01L 2224/94* (2013.01)

(56) References Cited

U.S. PATENT DOCUMENTS

| | | | |
|---|---|---|---|
| 2012/0129299 A1* | 5/2012 | Lin | H01L 21/4878 438/118 |
| 2013/0320535 A1* | 12/2013 | Tao | H01L 23/485 257/738 |
| 2016/0027694 A1 | 1/2016 | Truhitte et al. | |
| 2016/0181225 A1* | 6/2016 | Zeng | H01L 21/56 438/112 |

OTHER PUBLICATIONS

Tim Strothmann, Seung Wook Yoon, Yaojian Lin, Encapsulated Wafer Level Package Technology (eWLCS), Electronic Components & Technology Conference, IEEE 2014.

* cited by examiner

US 10,410,941 B2

WAFER LEVEL SEMICONDUCTOR DEVICE WITH WETTABLE FLANKS

BACKGROUND

The present invention relates to integrated circuit (IC) device assembly and, more particularly, to a wafer level semiconductor device with wettable flanks.

Wafer level packages (WLPs) are becoming increasingly important for applications that require a small footprint with improved electrical performance. Wafer level packages are commonly used, for instance, in mobile communications devices such as mobile telephones.

FIG. 1 is a cross-sectional side view of a conventional WLP 100. The WLP 100 includes a plurality of active pads 102 exposed on a bottom surface of the WLP 100. The active pads 102 are mounted to contact elements 104, such as pads on a printed circuit board (PCB) with solder 106.

FIG. 2 is an enlarged schematic bottom plan view of a part 108 of the WLP 100 along line A-A of FIG. 1. The bottom surface of the WLP 100 includes the active pad 102, which is a metal area, a saw scribe lane area 110 located at a peripheral area of the bottom surface of the WLP 100, which is a non-passivated area, and a passivation overlap area 112 located between the active pad 102 and the saw scribe lane area 110. However, as shown in FIG. 2, improper cleaning of the WLP 100, or excessive solder, together with a very narrow separation between the active pad 102 and the saw scribe lane area 110 can result in a flux residue or solder flake 114 may bridge the active pad 102 and the saw scribed lane area 110, which raises the possibility of an IR leakage issue. In addition, since the active pad 102 does not extend all the way to the side of the WLP 100, once the WLP 100 is mounted to the PCB and the active pads 102 are soldered to the corresponding contact elements 104, it is difficult to inspect the solder joints to determine if there are any potential solder joint defects. Accordingly, it would be advantageous to have a WLP with inspectable solder joints.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
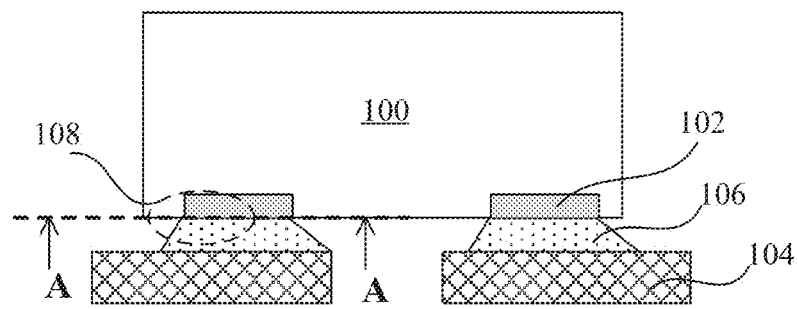
FIG. 1 is a cross-sectional side view of a conventional wafer level semiconductor device.
Figure 2:
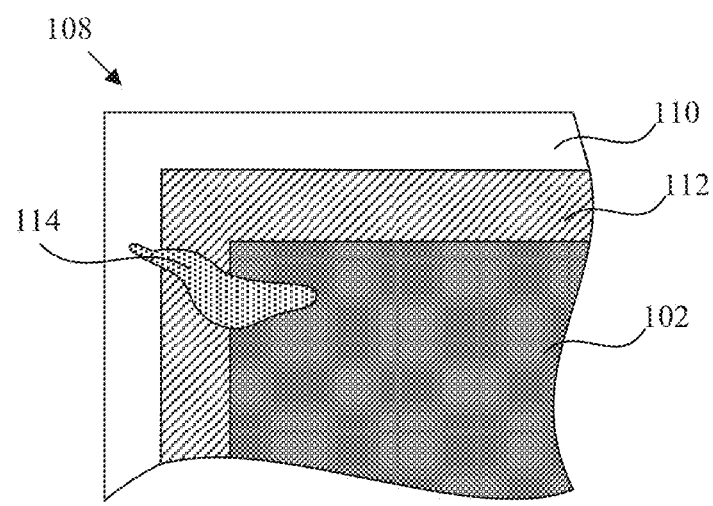
FIG. 2 is an enlarged bottom plan view of the conventional wafer level semiconductor device of FIG. 1 along line A-A of FIG. 1.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. It also should be noted that the drawings provide enlarged views and may not be drawn to scale so that particular features of the invention may be better understood. The terms "comprises," "comprising," or any variations thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a semiconductor device including a semiconductor die having a top surface that has one or more electrical contacts formed thereon, and an opposite bottom surface, and a molding material encapsulating the top surface and at least a part of a side surface of the semiconductor die. The molding material defines a package body that has a top surface and a side surface. A plurality of openings are formed on the top surface of the package body, and the plurality of electrical contacts are partially exposed from the molding material through the openings. The semiconductor device further includes a metal layer formed over and electrically connected to the electrical contacts through the openings. The metal layer extends to and at least partially covers the side surface of the package body.

In another embodiment, the present invention provides a method for packaging a semiconductor device. The method includes providing a wafer that has a top surface and an opposite bottom surface. The wafer includes a plurality of semiconductor dies and saw streets located between adjacent dies. Each semiconductor die has a plurality of electrical contacts formed on the top surface. The method also includes cutting the wafer along the saw streets to form a plurality of first trenches between adjacent semiconductor dies, and then encapsulating the semiconductor dies with a molding material. The molding material covers the top surfaces of the semiconductor dies and fills the first trenches. Openings are formed to at least partially expose the electrical contacts from the molding material. The method further includes cutting the first trenches to form a plurality of second trenches. The molding material defines a package body of each semiconductor device, such that each device has a top surface and a side surface. The method further includes forming a metal layer over the top surface of each package body. The metal layer fills the openings and electrically connects the electrical contacts. The metal layer also extends to the side surface of each package body and to a bottom surface of each second trench. The method includes selectively cutting the metal layer to electrically isolate the electrical contacts of each semiconductor die, and cutting the second trenches to singulate the semiconductor devices from each other.

Figure 3A:
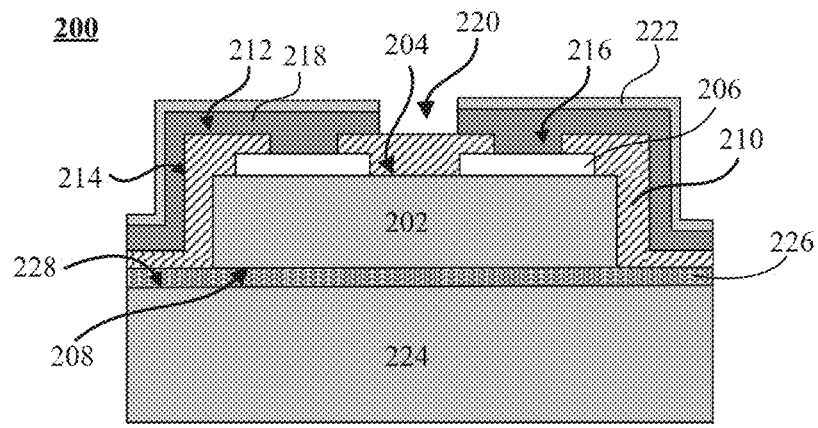
FIGS. 3A and 3B are respectively a cross-sectional side view and an isometric view of a wafer level semiconductor device with wettable flanks in accordance with an embodiment of the present invention.
Figure 3B:
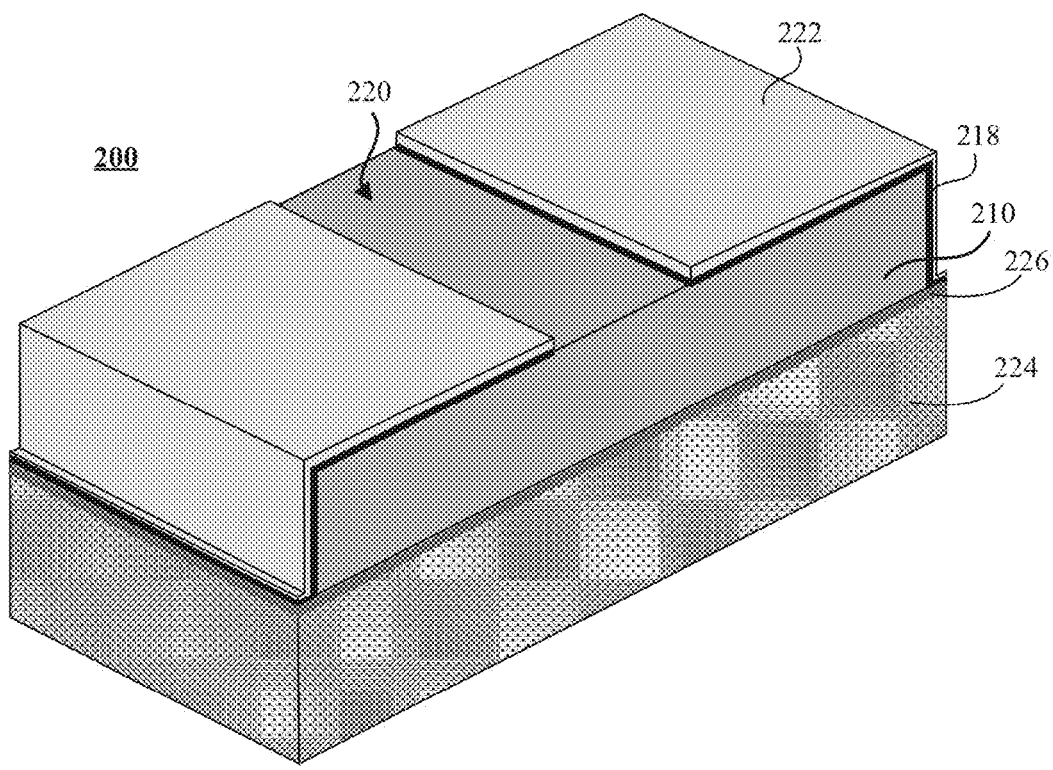

Referring now to FIGS. 3A and 3B, an example of a wafer level semiconductor device 200 with wettable flanks in accordance with an embodiment of the present invention is shown. In particular, FIG. 3A shows a cross-sectional side view of the wafer level semiconductor device 200, and FIG.

3B shows an isometric view of the device 200. The device 200 includes a semiconductor die 202 having a top surface 204 that has one or more electrical contacts 206 formed thereon, and an opposite bottom surface 208. In a preferred embodiment, the semiconductor die 202 comprises one or more active components (not shown) such as transistors or diodes, and the one or more electrical contacts 206. The electrical contacts preferably are formed by depositing a patterned metal layer on the die top surface 204, and provide electrical connections to the one or more active components within the semiconductor die 202.

The semiconductor device 200 also includes a molding material 210 that covers the top surface 204 and at least a part of a side surface of the semiconductor die 202. The molding material 210 defines a package body that has a top surface 212 and a side surface 214. One or more openings 216 are formed in the top surface 212 of the package body such that the electrical contacts 206 are at least partially exposed from the molding material 210 through the openings 216. The device 200 further includes a metal layer 218 formed over and electrically connected to the electrical contacts 206 through the openings 216. The metal layer 218 extends to and at least partially covers the side surface 214 of the package body. The metal layers 218, which are respectively electrically connected to the electrical contacts 206, are spaced and isolated from each other by a gap 220 located therebetween. The metal layers 218 form mounting pads of the semiconductor device 200. In a preferred embodiment, the metal layer 218 comprises copper. In another preferred embodiment, the metal layer 218 is coated with a wettable material 222, such as tin, by a plating process, such that the device 200 has wettable flanks that allow for solder joint inspection.

In a preferred embodiment, the device 200 includes a die carrier 224. The bottom surface 208 of the die 202 is mounted to a top surface of the die carrier 224 with an adhesive material 226. The die carrier 224 is preferably a semiconductor substrate. In a preferred embodiment, the molding material 210 further covers a peripheral area 228 of the top surface of the die carrier 224 that is not covered by the semiconductor die 202, and the metal layer 218 extends over the molding material 210 that covers the peripheral area 228.

Figure 4A:
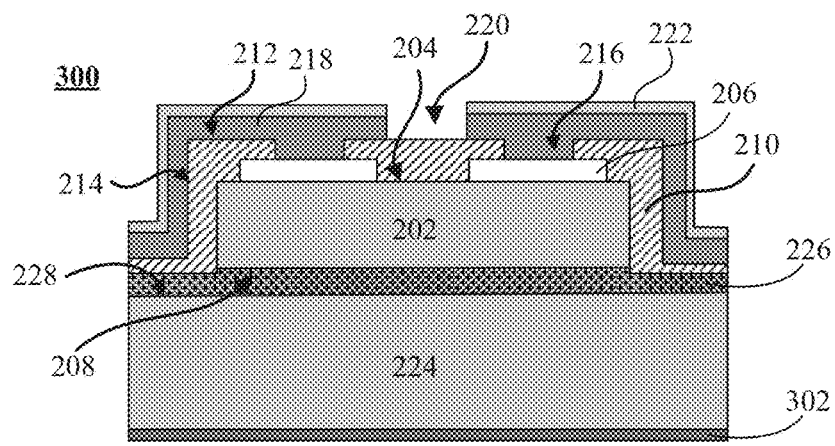
FIGS. 4A and 4B are respectively a cross-sectional side view and an isometric view of a wafer level semiconductor device with wettable flanks in accordance with another embodiment of the present invention.
Figure 4B:
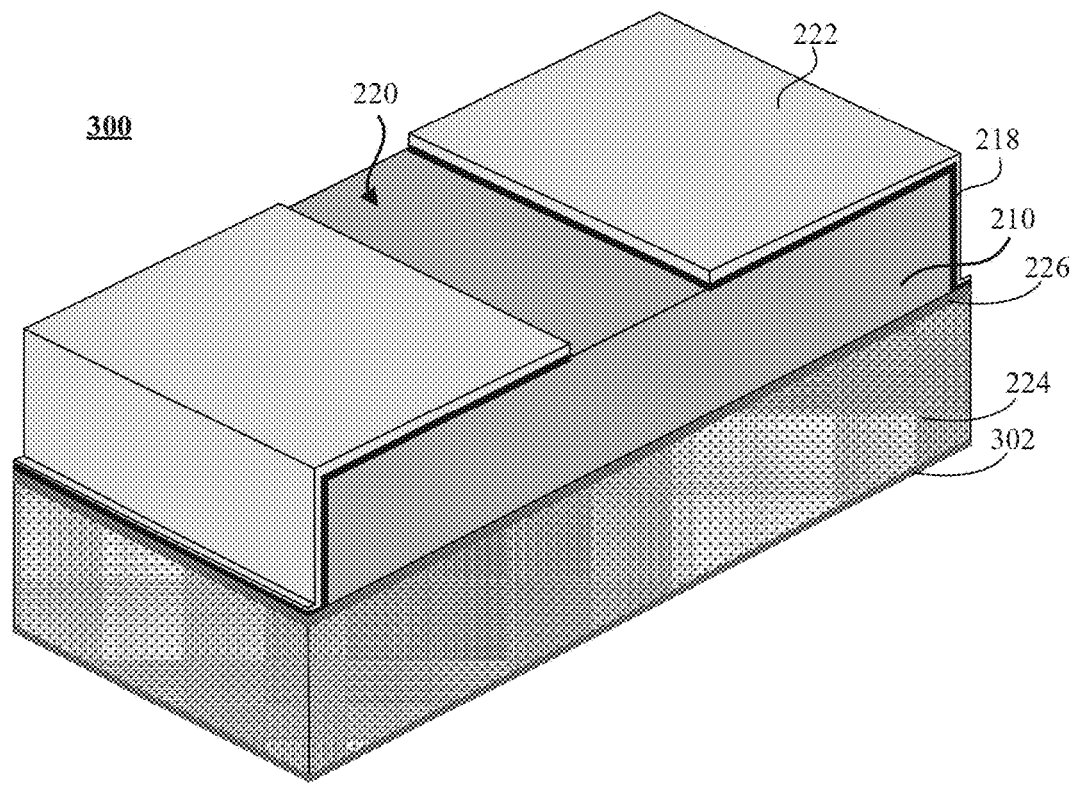

Referring now to FIGS. 4A and 4B, an example of a wafer level semiconductor device 300 with wettable flanks in accordance with another embodiment of the present invention is shown. The device 300 is substantially the same as the device 200 except that the device 300 further comprises a coating layer 302 formed on a bottom surface of the die carrier 224. The coating layer 302 provides mechanical and chemical protection to the back or bottom side of the device 300. In a preferred embodiment, the coating layer 302 blocks light. The coating layer 302 may comprise a non-conductive material such as plastic.

FIGS. 5-18 are a series of diagrams illustrating steps in assembling a wafer level semiconductor device with wettable flanks in accordance with another embodiment of the present invention.

Figure 5A:
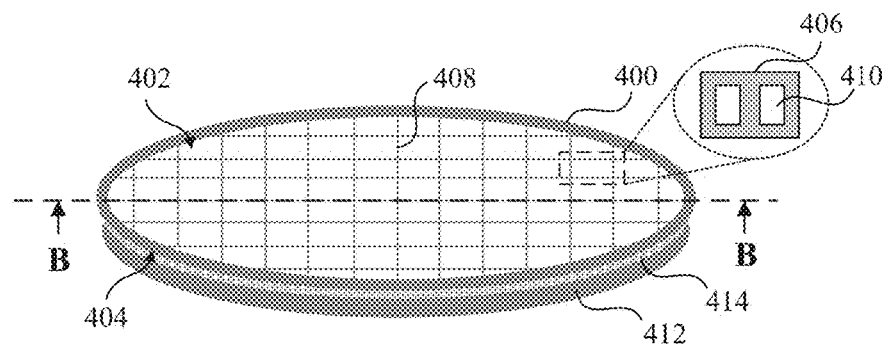
FIGS. 5A-5B, 6A-6B, 7-8, 9A-9B, 10A-10B, 11A-11B, 12, 13A-13B, 14, 15A-15B, and 16-18 are a series of diagrams illustrating steps in assembling a wafer level semiconductor device with wettable flanks in accordance with an embodiment of the present invention.
Figure 5B:
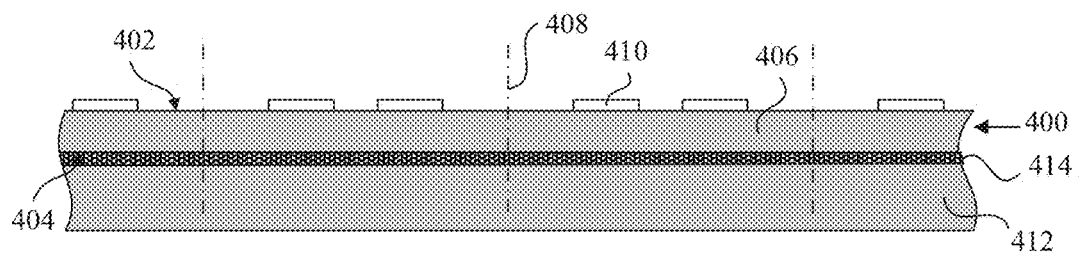

Starting with FIGS. 5A and 5B, a wafer 400 that has a top surface 402 and an opposite bottom surface 404 is provided. FIG. 5A is an isometric view of the wafer 400 and FIG. 5B is a cross-sectional side view of the wafer 400 from the line B-B of FIG. 5A. The wafer 400 comprises a plurality of semiconductor dies 406 and has saw streets 408 located between adjacent dies. Each die 406 has one or more electrical contacts 410 formed on the top surface 402. In a preferred embodiment, each die 400 comprises one or more active components (i.e., internal circuitry not shown) such as transistors or diodes, and the electrical contacts 400 that are preferably formed by depositing a patterned metal layer on the top surface 402, provide electrical connections to the active components within the die 406. In a preferred embodiment, the bottom surface 404 of the wafer 400 is mounted on a top surface of a carrier 412 with an adhesive material 414. In a preferred embodiment, the carrier 412 is a semiconductor substrate.

Figure 6A:
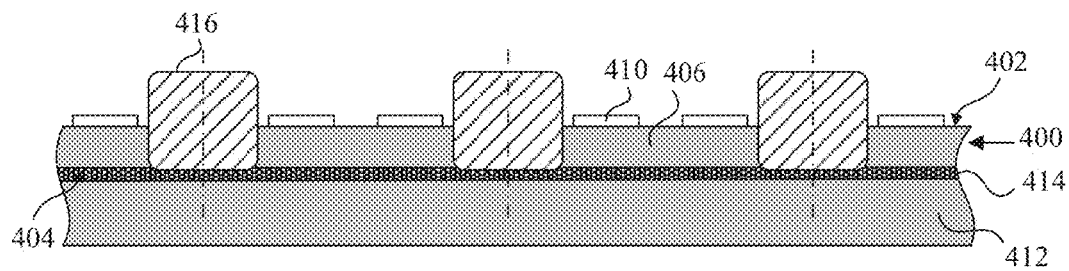
Figure 6B:
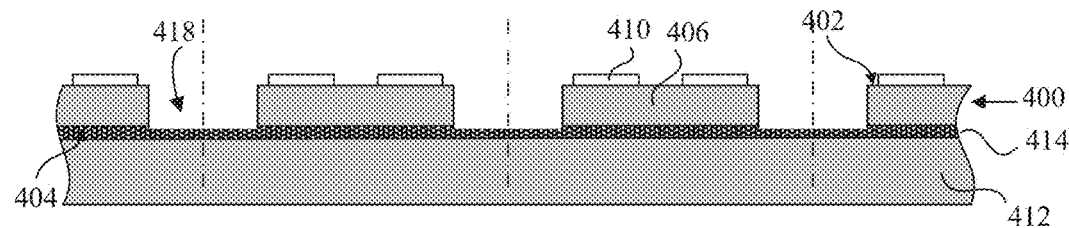

In the next step illustrated in FIGS. 6A and 6B, the wafer 400 is cut along the saw streets 408 with a first blade 416 to form a plurality of first trenches 418 between adjacent ones of the dies 406. In a preferred embodiment, the first blade 416 cuts down to the adhesive material 414. In another preferred embodiment, the first blade 416 cuts beyond the adhesive material 414 and into, and half-cuts, the carrier 412.

Figure 7:
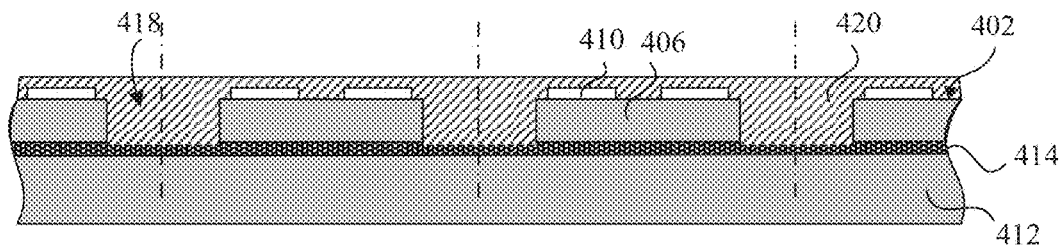
Figure 8:
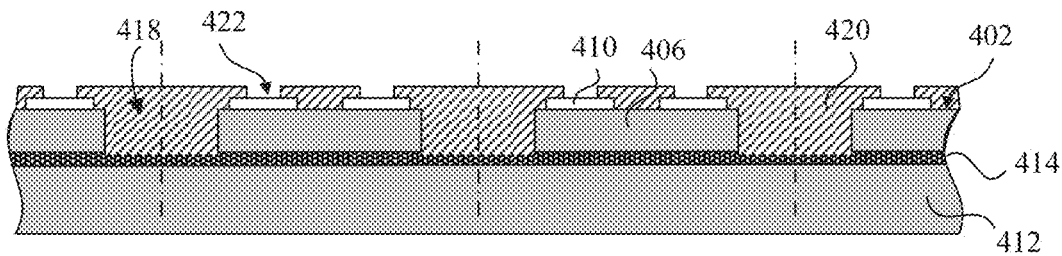

In the next step illustrated in FIG. 7, the semiconductor dies 406 are encapsulated with a molding material 420. The molding material 420 covers the top surfaces 402 of the dies 406 and fills the first trenches 418. Then in FIG. 8, one or more openings 422 are formed over the top surface of each die 406 to at least partially expose the corresponding electrical contacts 410 from the molding material 420. In a preferred embodiment, the openings 422 are formed by etching or laser drilling.

Figure 9A:
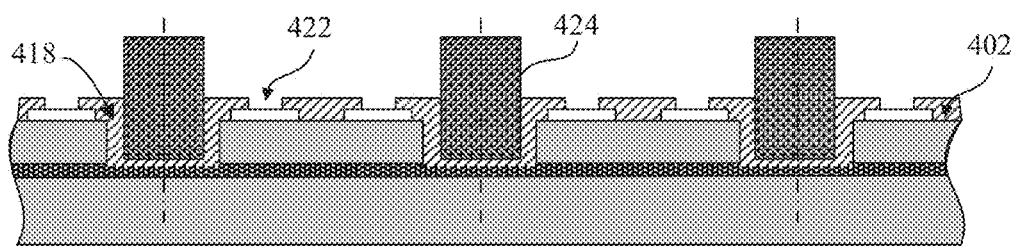
Figure 9B:
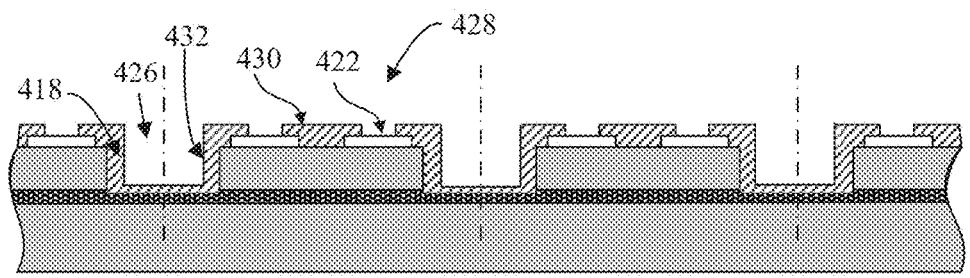

In the next step illustrated in FIGS. 9A and 9B, a half-cut is performed along the first trenches 418 with a second blade 424 to form a plurality of second trenches 426 respectively within the first trenches 418. After the half-cut, the molding material 420 defines a package body of each semiconductor device 428, defining a top surface 430 and a side surface 432.

Figure 10A:
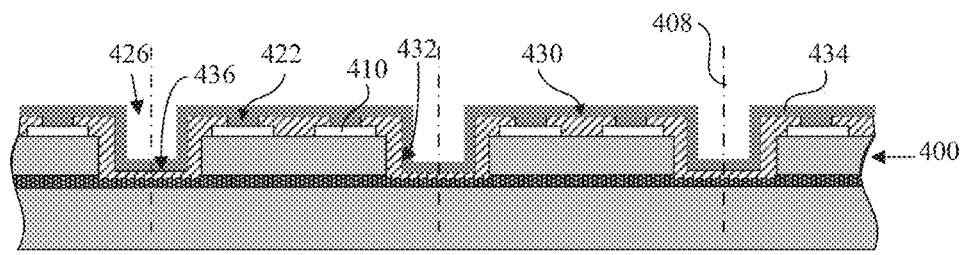
Figure 10B:
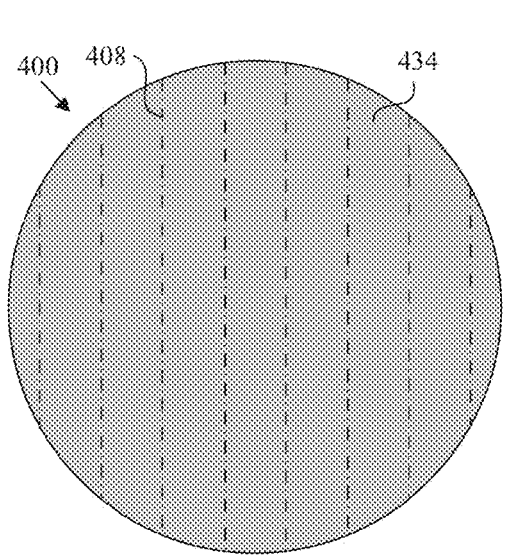

In the next step illustrated in FIGS. 10A and 10B, a metal layer 434 is formed over the top surface 430 of each package body. The metal layer 434 fills the openings 422 and electrically connects the die electrical contacts 410. The metal layer 434 also extends to the side surface 432 of each package body and a bottom surface 436 of each of the second trenches 426.

FIGS. 10A and 10B respectively show a cross-sectional side view and a top plan view of the wafer 400 after the metal layer 434 is formed thereover. In a preferred embodiment, the metal layer 434 is formed by sputtering or plating. In one embodiment, the metal layer 434 comprises copper.

Figure 11A:
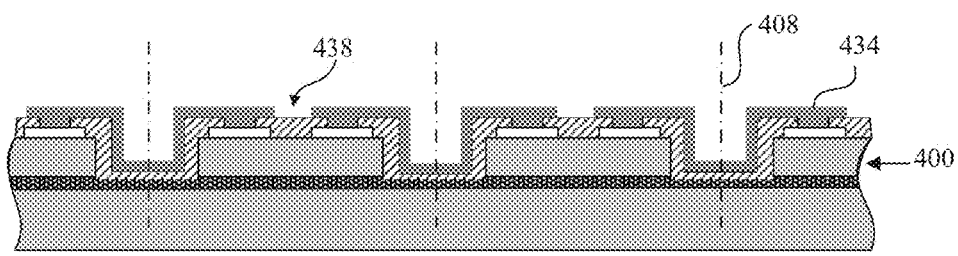
Figure 11B:
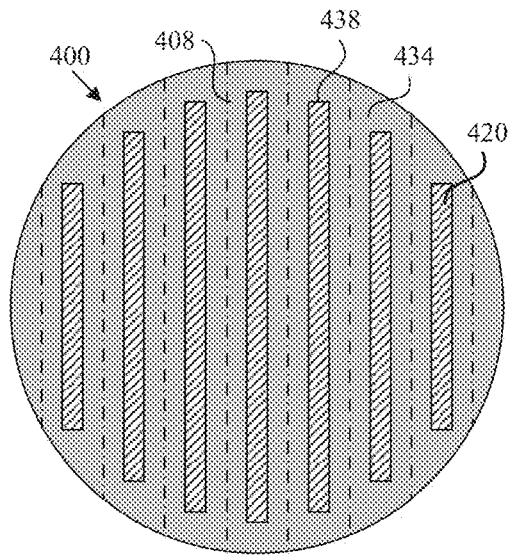
Figure 12:
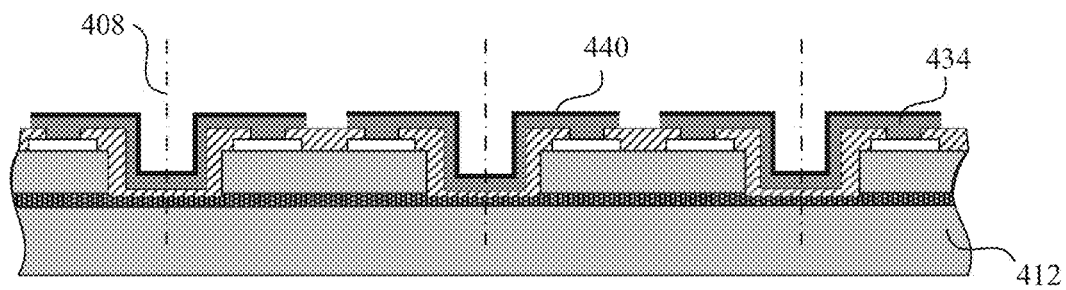

Then in FIGS. 11A and 11B, openings 438 are selectively formed within the metal layer 434 by half-cutting to electrically isolate the electrical contacts 410 of each semiconductor die from each other. FIGS. 11A and 11B respectively show a cross-sectional side view and a top plan view of the wafer 400 after the openings 438 are formed in the metal layer 434. The molding material 420 is exposed from the openings 438. In a preferred embodiment, the openings 438 are parallel to the saw streets 408 in one direction. In another preferred embodiment, the openings 438 do not extend to the edge of the wafer 400, such that the metal layer 434 comprises one piece of metal and is not split by any of the openings 438. In a preferred embodiment, as shown in FIG. 12, the metal layer 434 is coated with a wettable material 440 by electro-plating. The wettable material 440 may comprise tin. In an alternate embodiment, the electro-plating is performed before the openings 438 are formed.

Figure 13A:
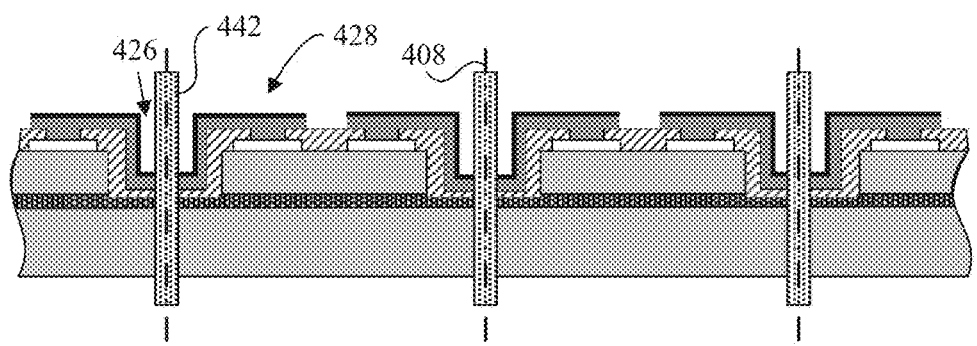
Figure 13B:
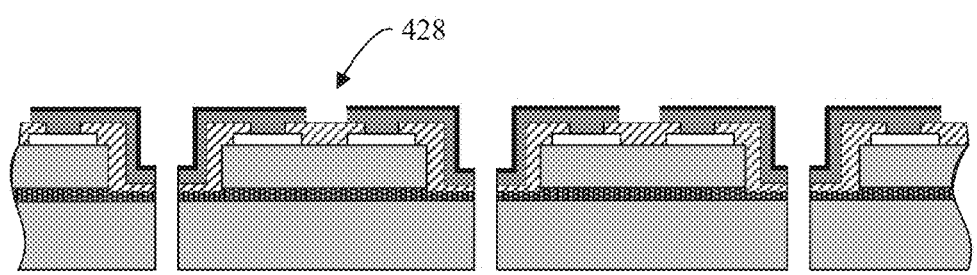

In the next step illustrated in FIGS. 13A and 13B, singulation is performed along the second trenches 426 with a second blade 442 to separate the semiconductor devices 428 from each other, where FIG. 13A shows the assembly being cut and FIG. 13B showing the separated devices 428.

Figure 14:
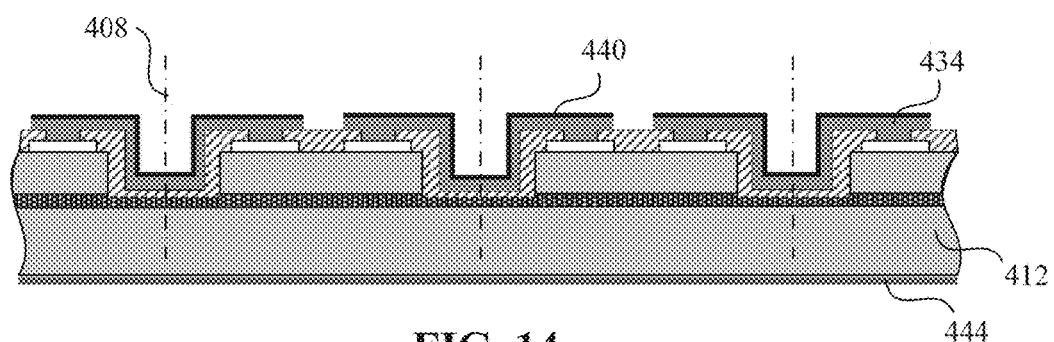
Figure 15A:
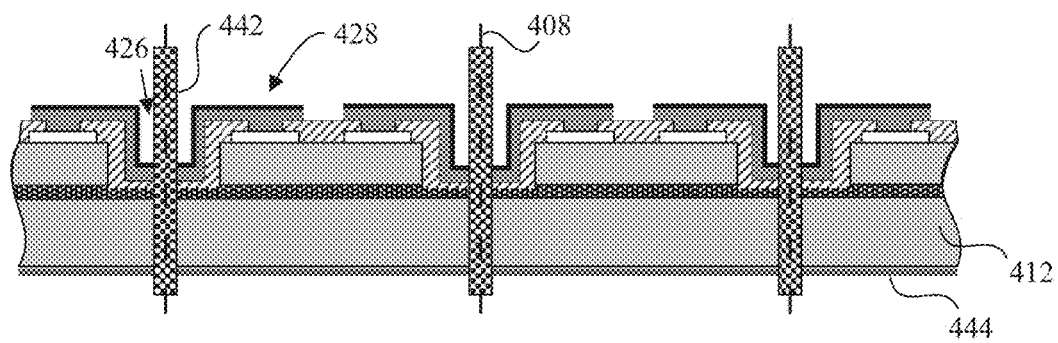
Figure 15B:
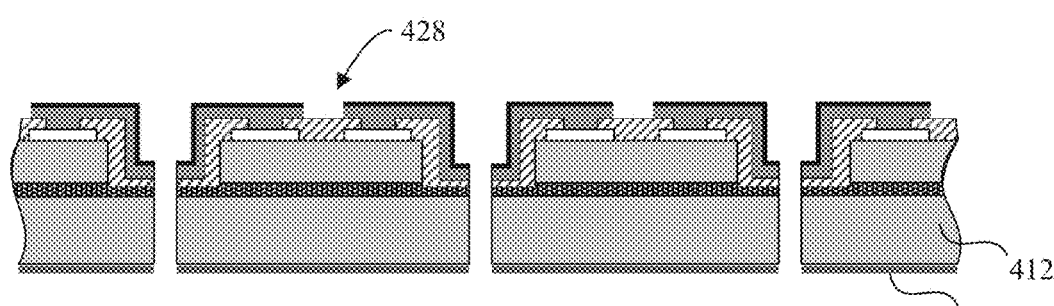

FIGS. 14, 15A and 15B illustrate steps that are substantially the same as the steps shown in FIGS. 12, 13A and 13B except that a coating layer 444 is formed on a bottom surface of the wafer carrier 412. The coating layer 444 provides mechanical and chemical protection to the backside of the semiconductor device 428. In a preferred embodiment, the coating layer 444 blocks out light. The coating layer 444 preferably comprises a non-conductive material such as plastic.

Figure 16:
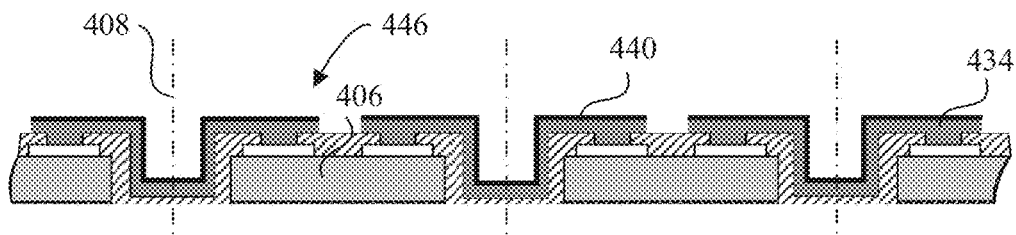
Figure 17:
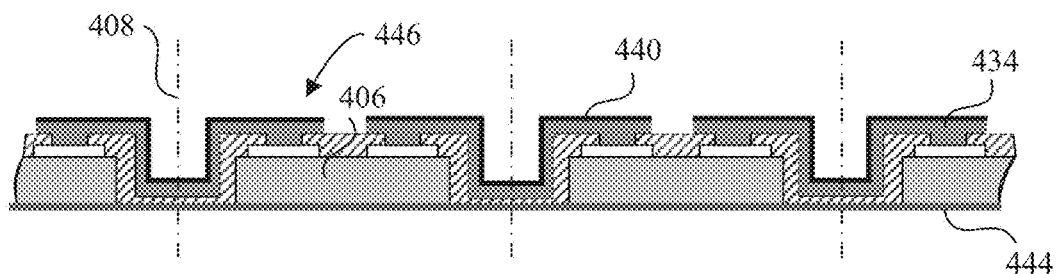
Figure 18:
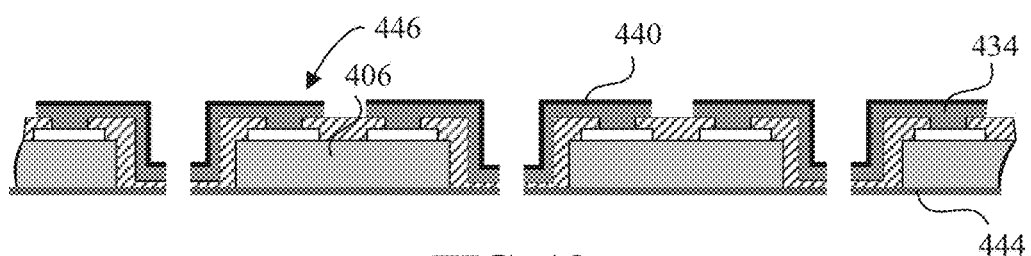

FIGS. 16-18 illustrate steps performed after the step shown in FIG. 12, in accordance with a preferred embodiment of the present invention.

In the step illustrated in FIG. 16, the wafer carrier 412 shown in FIG. 12 is removed. Then in the step shown in FIG. 17, a coating layer 444 (same as the coating layer 444 of FIG. 14) is formed on a bottom surface of the molded package bodies of semiconductor devices 446. The coating layer 444 provides mechanical and chemical protection for a backside of the semiconductor devices 446, especially a backside of the semiconductor die. In a preferred embodiment, the coating layer 444 blocks out light. In a preferred embodiment, the coating layer 444 comprises a non-conductive material such as plastic. In FIG. 18, singulation is performed along the second trenches 426 to separate the semiconductor devices 446 from each other.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A semiconductor device, comprising:
a semiconductor die having a top surface that has one or more electrical contacts formed thereon, and an opposite bottom surface;
a molding material encapsulating the top surface and at least a part of a side surface of the semiconductor die, wherein the molding material has a top surface and a side surface that defines a package body;
a plurality of openings formed on the top surface of the package body, wherein the plurality of electrical contacts are partially exposed from the molding material through the openings; and
a metal layer formed over the top surface of the molding material and electrically connected to the electrical contacts through the openings, wherein the metal layer extends from from the top surface of the molding material to the side surface of the molding material and at least partially externally covers the side surface of the molding material that defines the package body and no molding material is external to the metal layer.

2. The semiconductor device of claim 1, wherein the metal layer is coated with a wettable material by electrically conductive plating.

3. The semiconductor device of claim 1, wherein the metal layer comprises copper.

4. The semiconductor device of claim 1, further comprising a layer of non-conductive material coated on a bottom surface of the package body.

5. The semiconductor device of claim 1, further comprising a die carrier, wherein the bottom surface of the semiconductor die is mounted to a top surface of the die carrier.

6. The semiconductor device of claim 5, further comprising an adhesive material that attaches the bottom surface of the semiconductor die to the top surface of the die carrier.

7. The semiconductor device of claim 5, wherein the molding material encapsulates a peripheral area of the top surface of the die carrier that is not covered by the semiconductor die.

8. The semiconductor device of claim 7, wherein the metal layer extends from the side surface of the package body to the peripheral area of the top surface of the die carrier.

9. The semiconductor device of claim 5, further comprising a layer of non-conductive material coated on a bottom surface of the die carrier.

10. A method for assembling a semiconductor device, the method comprising:
providing a wafer that has a top surface and an opposite bottom surface, wherein the wafer comprises a plurality of semiconductor dies and saw streets located between adjacent ones of the dies, wherein each die has a plurality of electrical contacts formed on the top surface;
cutting the wafer along the saw streets to form a plurality of first trenches between adjacent ones of the dies;
encapsulating the dies with a molding material, wherein the molding material covers top surfaces of the dies and fills the first trenches;
forming openings to at least partially expose the electrical contacts from the molding material;
cutting the plurality of first trenches to form a plurality of second trenches, wherein the molding material defines a package body of each semiconductor device that has a top surface and a side surface;
forming a metal layer over the top surface of the molding material of each package body, wherein the metal layer fills the openings to electrically connect the electrical contacts, and the metal layer extends from the top surface of the molding material to the side surface of the molding material of each package body and to a bottom surface of each second trench;
selectively cutting the metal layer to electrically isolate the electrical contacts of each die from each other; and
cutting in the second trenches to singulate the semiconductor devices from each other.

11. The method of claim 10, further comprising mounting the bottom surface of the wafer to a top surface of a wafer carrier.

12. The method of claim 11, wherein the bottom surface of the wafer is mounted to the top surface of the wafer carrier with an adhesive material.

13. The method of claim 10, wherein the metal layer comprises copper.

14. The method of claim 10, wherein the metal layer is formed by sputtering or plating.

15. The method of claim 10, further comprising coating the metal layer with a wettable material by electro-plating.

16. The method of claim 10, further comprising forming a non-conductive coating layer on a bottom surface of the semiconductor device.

17. The method of claim 16, wherein the non-conductive coating layer comprises a light-blocking plastic material.

18. The semiconductor device of claim 1, wherein the metal layer includes a gap that electrically isolates the electrical contacts from each other.

* * * * *